United States Patent [19]

Pigeon et al.

[11] 4,299,893

[45] Nov. 10, 1981

[54] PHOTOSENSITIVE ARTICLE FOR MAKING VISUAL AIDS WITH DIAZONIUM COMPOUNDS AND LIQUID EPOXY RESIN

[75] Inventors: Marcel Pigeon; Marta Szretter, both of Neuilly; Chantal Périé, Paris, all of France

[73] Assignee: Rhone-Poulenc Systemes, Cretiel, France

[21] Appl. No.: 134,326

[22] Filed: Mar. 26, 1980

[30] Foreign Application Priority Data

Mar. 28, 1979 [FR] France ............................... 79 07747

[51] Int. Cl.$^3$ .................. G03C 1/54; G03C 1/60; G03C 1/78

[52] U.S. Cl. ........................................ 430/8; 430/157; 430/175; 430/176; 430/280; 430/292; 430/293; 430/294

[58] Field of Search ............... 430/175, 176, 280, 157, 430/292, 293, 294, 8

[56] References Cited

U.S. PATENT DOCUMENTS

| | | | |
|---|---|---|---|
| 3,199,981 | 8/1965 | Sus et al. | 430/175 |
| 3,205,157 | 9/1965 | Licari et al. | 430/280 |
| 3,295,974 | 1/1967 | Erdmann | 430/280 |
| 3,396,019 | 8/1968 | Uhlig | 430/176 |
| 3,622,333 | 11/1971 | Cope | 430/176 |
| 3,660,097 | 5/1972 | Mainthia | 430/175 |
| 3,790,385 | 2/1974 | Steppan et al. | 430/176 |
| 3,794,576 | 2/1974 | Watt | 430/280 |
| 4,092,170 | 5/1978 | Houtermans et al. | 430/175 |
| 4,093,465 | 6/1978 | Chu et al. | 430/175 |
| 4,218,531 | 8/1980 | Carlson | 430/280 |

*Primary Examiner*—Charles L. Bowers, Jr.
*Attorney, Agent, or Firm*—Sherman & Shalloway

[57] ABSTRACT

Montage films, duplicating films, color guide films, microfiche film, color transparencies and similar visual aids are prepared from photosensitive articles having a layer of a photosensitive composition coated on a transparent support, preferably a flexible plastic transparent support.

The exposed articles are developable with water to form the visual aid. The photosensitive layer is formed from a composition which includes a photosensitive reaction product of a condensation product of a diazonium compound with an arylsulfonic acid, and an epoxy resin which is liquid at ambient temperatures. The diazonium compound is preferably a paradiazodiphenylamine and the preferred condensing agent is formaldehyde or paraformaldehyde.

The photosensitive layer can be colored with a permanent dye of a color depending on the type and use of the visual aid.

Best results, with regard to water-developability and mechanical strength, are provided by first coating the transparent support with an intermediate layer of an adhesive resin.

35 Claims, No Drawings

PHOTOSENSITIVE ARTICLE FOR MAKING VISUAL AIDS WITH DIAZONIUM COMPOUNDS AND LIQUID EPOXY RESIN

RELATIONSHIP TO OTHER APPLICATIONS

This application is related to our application titled "WATER-DEVELOPABLE FILM-FORMING PHOTOPOLYMERIZABLE COMPOSITIONS AND NEGATIVE WORKING LITHOGRAPHIC PLATES PREPARED THEREFROM" filed on the same day as this application (Ser. No. 134,328).

BACKGROUND OF THE INVENTION

(1) Field of the Invention

This invention relates to photosensitive films and similar articles useful in preparing visual aids, such as films for preparing montages, duplicating films, color guides, films for microfiches and similar microcopies, and generally wherever it is desired to have a mono- or polychromatic reproduction of an original (transparency or mask) useful in itself or as an intermediate. More particularly, this invention relates to negative-working photosensitive articles useful for making visual aids by imagewise exposure of a layer of a negative-working photosensitive photopolymerizable composition deposited on a transparent support to actinic light followed by development with water.

The articles of the present invention are generally useful in the field of planographic reproduction.

In our application filed on even date, mentioned above, we describe film-forming, oleophilic photopolymerizable compositions which are soluble in organic solvents. These compositions are suitable for use as the photosensitive layer of water-developable, negative-working lithographic plates when deposited as a layer (film) on a suitable hydrophilic support. These photopolymerizable compositions comprise at least one epoxy resin monomer or prepolymer which is fluid at ambient temperature and which has an epoxy equivalent of less than about 350, preferably less than about 200, and a photosensitive reaction product of a water-soluble, photosensitive condensation product of a diazonium compound and an organic condensation agent with an organic coupling agent which is capable of rendering the photosensitive reaction product soluble in organic solvent but only slightly soluble in water.

In the present invention, these same or similar photopolymerizable compositions, which may further include one or more dyes to obtain particular visual effects, are deposited on a transparent support, which is not hydrophilic, to obtain the photosensitive articles for making visual aids such as montages, duplicating films, color guides, microfiche films and the like.

(2) Discussion of the Prior Art

Planographic reproduction techniques are, of course, very old and have undergone extensive developments with respect to all of its different aspects, including the types of substrates, types of photosensitive compositions, types of inks, etc., as well as with respect to the development of new applications in the graphic arts.

As used in the present application, the term "visual aid" is intended to broadly include all types of image-bearing transparent films and plates, whether monochromatic or polychromatic images, clear or colored backgrounds, flexible or rigid supports, etc. Furthermore, the visual aids may be directly useful for displaying information (although appropriate projection or reading systems may be required, as with microfiche films) or they may simply be intended as screens or guides for preparing other products, such as montage films and color guide or selection films.

Montage films, for example, are used to provide a base film which can be used for registering and positioning the various colors of a montage. Generally, the montage films produce a faint blue color upon exposure. These films are not sensitive to ultraviolet light and therefore they can be used with color selection films without interfering with the copying of the latter.

Color guide (or color selection) films are films of the three complementary colors: cyan, magenta and yellow, which by superposition on a white background make it possible to see the final color that would be obtained, for example, by polychromatic lithographic printing. In addition, more than the three complementary colors can be used in these color guides when it is intended, for example, to use these films as transparencies in overhead projection units and the like.

"Graphic Arts" type duplicating films, such as those sold by du Pont de Nemours & Co. under their trademark CRONA-LITE are line and screen duplicating films having a rather high density. These films absorb ultraviolet light and are generally black in appearance.

Microfiche films are black-chestnut colored films which obviously require very dense but clear copy so that the microcopied information can be read on the microfiche readers with good contrast.

In all of these application, the support used is transparent and is preferably made of flexible plastic.

Color guide films are described in French Pat. No. 2,001,413, in particular in Example 17.

These films are developed, after exposure to ultraviolet rays through a screened original exhibiting transparent zones and opaque zones, with an aqueous solution containing 20% wetting agent such as sodium lauryl sulfate. To obtain a good development, without deterioration of the layer, it is, however, preferable to add a little acid to the developing solution.

The composition coated on the transparent polyester support is made up of a 5% solution, in methylcellosolve, of a condensation product of p-diazodiphenylamine with paraformaldehyde coupled with 2-hydroxy-4-methoxybenzophenone-5-sulfonic acid and 2% of an epoxy resin EPON 1031 of the SHELL CHEMICAL COMPANY.

The visual aid articles, such as listed above, are generally handled without special precautions, and it is therefore necessary to use photosensitive layers having a good resistance to abrasion, i.e. having hardness and a good tenacity. For this purpose, photosensitive layers with an epoxy resin base are quite suitable.

However, the photosensitive layers as described above which are used in making visual aid articles have the drawback of requiring special developers.

SUMMARY OF THE INVENTION

Accordingly, it is an object of the present invention to provide presensitized films or sheets having a photopolymerizable layer thereon which is developable with water and which is used as a visual aid.

It is a further object of the invention to provide a water-developable visual aid in which the photopolymerized, crosslinked and hardened layer has high mechanical strength and long useful life.

It is still a further object of the invention to provide films and sheets for visual aids in which the photopolymerizable layer has a long shelf-life in addition to a long working life and which is easily developable with water.

These and other objects of the present invention are accomplished by depositing on a suitable transparent support a film-forming, oleophilic photopolymerizable composition which is soluble in organic solvents and which is formed from (1) an epoxy resin forming monomer or prepolymer which is fluid at ambient temperature and which has an epoxy equivalent of less than about 350; and (2) a photosensitive reaction product of (a) a water-soluble, photosensitive condensation product of (i) a diazonium compound and (ii) an organic condensation agent, and (b) an organic coupling agent. By suitable selection of the organic coupling agent, the photosensitive reaction product (2) is made soluble in organic solvents and only slightly soluble in water. Accordingly, when an organic solvent solution of the photopolymerizable composition is deposited on a transparent support and imagewise exposed to ultraviolet light, the exposed zones are polymerized and hardened while the unexposed zones are easily removable by development with water.

Quite unexpectedly, it has now been found, in accordance with the present invention, that by using photopolymerizable compositions containing photosensitive reaction products, preferably derived from an aromatic diazonium compound and an epoxy resin which is fluid at ambient temperature (the fluidity of the resin being enhanced in the absence of solvent) as the photosensitive layer on a suitable transparent support, the zones exposed to actinic light polymerize and are hardened while the unexposed zones can be removed by simple rinsing with flowing water. Such a feature has very important practical interest since the use of solvents or aqueous solutions containing a wetting agent for development of the latent image can be eliminated. Therefore, an article for use as a visual aid comprising a transparent support coated with a thin layer of the photopolymerizable composition of this invention can be exposed, developed and dried in just a few minutes.

The present invention will now be described in greater detail in connection with the following description and accompanying examples.

DETAILED DESCRIPTION OF THE INVENTION AND PREFERRED EMBODIMENTS

The first essential component of the film-forming, oleophilic photopolymerizable compositions of this invention is an epoxy resin forming monomer or prepolymer which is fluid at ambient temperature and which has an epoxy equivalent of less than about 350. As used in the present specification and appended claims, the term "ambient temperature" refers to the atmospheric temperature of the working environment and typically will be a temperature of at least about 15° C. and more typically refers to a temperature in the range of from about 18° C. to about 30° C.

The fluidic nature of the epoxy resins used in the compositions of this invention can be defined in the same manner as in American Can Co.—U.S. Pat. No. 3,794,576, the disclosure of which is incorporated herein by reference. A specific method that can be used to define the fluidity limit of the epoxy resins usable in this invention is, for example, the Durran method. According to this method, the melting point of the epoxy resin is considered to be that temperature at which the molten resin reaches the summit of the mercury. This method is described in detail in "Analytic Chemistry of Polymers", Part I, pp. 155–156, edited by Goldon M. Kline, Interscience Publishers, Inc., New York.

In the present invention, according to the Durran measuring method, it is preferred that the fluid epoxy resins have a Durran melting point of about 38° C. or less, preferably about 27° C. or less and most preferably about 20° C. or less. The lower limit of the melting point measured by the Durran method is not particularly critical except that it is preferred, in general, to use fluid epoxy resins having a viscosity of at least about 5000 centipoises.

Epoxy resins having Durran melting points greater than 38° C. are too highly viscous to form uniformly smooth thin coating layers. On the other hand, with fluid epoxy resins having a viscosity of less than about 5000 centipoises, it becomes difficult in certain cases to obtain a photopolymerizable layer which, after depositing on a support, is not sticky. This is also disadvantageous for obvious reasons, including the difficulty in obtaining smooth layers as well as the risk of picking up dirt, etc.

In general, within the above noted limits, as the Durran melting point decreases, the stability of the photosensitive composition and the transparent support coated with a layer of the photopolymerizable composition increases. Thus, for epoxy resins having a Durran melting point below about 38° C. to about 27° C., water development is possible only for a few days after coating to achieve the greatest clarity or sharpness in the reproduced images. For epoxy resins having a Durran melting point in the range of from about 20° C. to about 27° C., water development of the exposed photopolymerizable composition is possible for about ten days while still being able to obtain the greatest sharpness and clarity of reproduced lines from the original transparency or mask.

With fluid epoxy resins having Durran melting points of about 20° C. or less, photosensitive compositions and visual aids are obtained having a shelf-life of several weeks and even several months or more and are still water developable after these extended storage periods. This is, of course, highly desirable in the case of presensitized articles for use as visual aids.

The epoxy resins can be used alone or in mixtures to adjust their viscosity to fall within the limits described above. It is possible, for example, and it is advantageous in some cases, to use an epoxy resin with a viscosity less than 5000 centipoises in mixture with an epoxy resin with a higher viscosity to thereby obtain a mixture that can be developed with water for several months or even years. It is also possible, for example, to use a mixture of epoxy resins which include at least one resin with a viscosity less than about 5000 centipoises and at least one resin having a Durran melting point above 20° C. and still obtain photopolymerizable compositions which can be coated on a suitable transparent support which can be exposed and developed with water alone to obtain faithful reproductions even after storage for several months or more. It is thus apparent that it will be possible for a man of ordinary skill in this art following the above teachings to develop all sorts of mixtures of epoxy resins, depending on the desired purpose of the photopolymerizable composition. Again, reference is made to the discussion in U.S. Pat. No. 3,794,576 for more detailed discussion on the characteristics and mode of preparation of fluid epoxy resins.

It is another requirement of the epoxy resins of this invention that they have an epoxy equivalent of less than about 350. In the present application, the epoxy equivalent of an epoxy resin is understood to be that weight, in grams, of the resin that contains a gram-equivalent of epoxy groups. For epoxy resins having epoxy equivalent of more than about 350, the hardness and tenacity of the developed visual aid is insufficient. Preferably, the epoxy resins have an epoxy equivalent less than or equal to about 200 since, to obtain the optimum degree of hardness of the developed visual aid, it is preferred to have the greatest possible number of epoxy groups throughout the photopolymerizable layer.

For a further detailed description of epoxy resins, one can refer to pages 312-329 of the first supplement volume of "Encyclopedia of Chemical Technology" edited by Kirk and Othmer and published by Interscience Encyclopedia, Inc., New York, 1957, and pages 340-528 of the text "Epoxy Verbindungen Und Epoxy-harz" edited by Paquin, published by Springler-Verlag, Berlin, Gottingen Und Heidelberg, 1958.

In general, suitable fluid epoxy resins for use in the visual aid articles of the present invention include glycidyl ethers of bisphenol A, novolac phenol or cresol epoxy resins, and the like. The diglycidyl ethers of bisphenol A are especially preferred.

By way of non-limiting example, mention can be made of the following fluid epoxy resins which are currently available on the market and which are especially suitable for use in the present invention:

ARALDITE, grades GY 255, GY 260, EPN 1138 and EPN 1139, trademark products sold by CIBA GEIGY LTD: and EPON or EPIKOTE, grade numbers 827, 828, 834, etc., trademark products of the Shell Chemical Company.

The second essential component of the film-forming, oleophilic photopolymerizable compositions used in the articles of this invention is a photosensitive reaction product of a particular water-soluble, photosensitive condensation product and an organic coupling agent. This photosensitive reaction product must be soluble in organic solvents and also soluble in water, but only slightly. This slight degree of solubility in water will be described in greater detail below, but in general, it is that degree of solubility which allows for the water development of the photopolymerizable composition which has been imagewise exposed to actinic radiation. The solubility in organic solvents is required so that a thin uniform layer of the photosensitive composition can be deposited on a support from a solvent solution.

The first component of the photosensitive reaction product is a water-soluble, photosensitive condensation product of a diazonium compound and an organic condensation agent. Generally, the diazonium compounds that can be used in the photopolymerizable compositions are water-soluble photosensitive products with negative functional groups such as aromatic diazo compounds and especially diazo arylamines which may be substituted on the aromatic ring or on the amino group. The most preferred diazonium compound is a paradiazodiphenylamine which is readily available commercially. In general, however, the aromatic diazo compounds as disclosed in the U.S. Pat. No. 3,396,019 can be used as the aromatic diazo compounds in the compositions of the present invention and the disclosure of this reference is incorporated herein by reference.

These diazonium compounds are condensed with organic condensation agents having reactive carbonyl groups and preferably are selected from aldehydes and acetals. Formaldehyde and paraformaldehyde are especially preferred organic condensation agents. The preparation of these water-soluble, photosensitive condensation products are described, for example, in British Pat. No. 418,011, the disclosure of which is incorporated herein by reference.

Generally speaking, the reaction between the aromatic diazo compound and organic condensation agent is carried out in an aqueous medium in the presence of an acid condensing agent and at room temperature or while cooling. The acid condensing agent may, for example, be hydrochloric acid or sulfuric acid, or any of the other well known acid condensing catalysts. The amounts of the reactants and the time of the reaction are selected so that the resulting condensation product is water-soluble.

The water-soluble, photosensitive condensation product is reacted with an organic coupling agent which is capable of changing the ionic character of the condensation product to yield a photosensitive reaction product which has good solubility in organic solvents, but has only slight solubility in water. However, as will be described in greater detail below, it is an essential feature of this invention that the photosensitive reaction product not be totally insoluble in water, but have slight water solubility. Otherwise, the photopolymerizable compositions cannot be developed with water.

As mentioned above, it is necessary to use organic coupling agents that tend to diminish the ionic character of the diazonium compounds so as to obtain a reaction product soluble in organic solvents and slightly soluble in water. It is possible during preparation of the reaction product in an aqueous medium to tell immediately whether this product is suitable or not in the photopolymerizable compositions of the invention: when an organic coupling agent is used that has one or more strong electronegative substituents, such as, for example, a nitro or halogen group, a reaction product is obtained that immediately precipitates and which can be easily filtered. Such a product is insoluble in water and therefore is not suitable within the context of this invention: after application on a support, such compositions can be developed only with an aqueous acid solution. On the other hand, when the organic coupling agent is properly selected, the resulting photosensitive reaction product precipitates during its preparation in the form of a paste that must then be redissolved in another solvent. Accordingly, one of ordinary skill will be able to readily determine by simple experimentation whether a particular organic coupling agent, and consequently the photosensitive reaction product, is suitable for this invention.

Preferably, arylsulfonic acids and, in particular, alkylaryl sulfonic acids are selected as the organic coupling agent. By "alkyl" is understood a carbon chain length of 10 or less carbon atoms which may be substituted. Preferably, an alkylarylsulfonic acid will be used having one or more substituents selected from hydrogen, methyl and ethyl groups. The term "aryl" designates a simple or condensed aromatic ring. Preferably, however, a simple aromatic ring will be used, because it is possible under certain circumstances not to obtain a very easy water development with condensed aromatic rings. Again, this can readily be determined by simple and routine experimentation.

For example, it has been found that mono- or polysulfonic acids of naphthalene, which may optionally be substituted, are less desirable as the organic coupling agent of condensed paradiazodiphenylamine formaldehyde since water development in this specific case is very difficult. For this reason, as a general rule, it is preferred to select the coupling agent from benzene sulfonic, toluene sulfonic and dimethylbenzenesulfonic acids, preferably 2,5-dimethylbenzenesulfonic acid.

It has also been found that the choice of the substituent on the aromatic ring of the arylsulfonic coupling acid has a direct influence on the properties of the photosensitive reaction product, i.e. on the behavior of the salt of this acid with the diazo compound, e.g. paradiazodiphenylamine, condensed with a condensation product as defined above and on the development of the photopolymerizable composition according to the invention.

Without wishing to be bound by any particular theory, applicants have found that the influence of the substituents on the functional (reactive) groups is represented by the Hammet equation:

$$\rho\sigma = \log K/Ko$$

wherein Ko and K are reaction rate constants, $\sigma$ is the substituent coefficient (Hammet $\sigma$ constant) and $\rho$ is the coefficient of a defined reaction.

The Hammet $\sigma$ constant, as referred to in the present invention, is a parameter of the degree of reactivity of a substitution reaction on a group bonded to a nuclear carbon atom at a certain position of an aromatic group (for example, a benzene nucleus) or on the nuclear carbon atom, as is described in detail in "Physical Organic Chemistry", G. P. Hammet, McGraw-Hill Book Company, Inc. (1940). This degree of reactivity is affected by the degree of electron attractability or electron donatability of substituents attached to the other positions of the aromatic group.

The Hammet $\sigma$ constant, as referred to in the present invention, is an arithmetic sum of the Hammet $\sigma$ constants of the electron-attracting groups and electron-donating groups bonded to the aromatic group, which are determined by the positions and types of these groups.

When it is difficult to calculate a Hammet $\sigma$ constant of a given aromatic ring structure if values for the substituents are not found in the above book or other literature references, the above parameters can be actually measured by the method disclosed at pages 81 to 103 of the above book.

According to this equation, the electron-attracting substituent groups have a positive $\sigma$ coefficient in relation to hydrogen whose coefficient is equal to 0, while the electron-donating substituent groups have a negative coefficient in relation to hydrogen.

The following table gives the value of $\sigma$ for several substituents:

| Substituents | Value of Hammet $\sigma$ Constant |
| --- | --- |
| H | 0 |
| p.Cl | +0.227 |
| p.Br | +0.232 |
| p.NO$_2$ | +0.778 |
| m.NO$_2$ | +0.710 |
| p.CH$_3$ | +0.170 |

-continued

| Substituents | Value of Hammet $\sigma$ Constant |
| --- | --- |
| p.OC$_2$H$_5$ | +0.250 |
| p.OCH$_3$ | +0.268 |
| p.C$_2$H$_5$ | −0.151 |
| m.CH$_3$ | −0.069 |
| p.i.C$_3$H$_7$ | −0.151 |
| p.tert C$_4$H$_9$ | −0.197 |
| 3,4-di (CH$_3$) | −0.229 |

Applicants have found that substituent groups having an Hammet $\sigma$ constant of 0 or less than zero (negative), i.e. hydrogen or electron-donating groups are suitable for use in the present invention.

The reaction between the water-soluble photosensitive condensation product, typically a condensation product of paradiazodiphenylamine with paraformaldehyde, which is currently available in the commercial market and therefore preferred for use in this invention, and the organic coupling agent, preferably the arylsulfonic acid, is carried out by mixing with vigorous agitation aqueous solutions of the condensation product and coupling agent in the presence of additional acid, preferably an inorganic acid, such as phosphoric acid, to provide an acidic pH of from about 4.5 to about 2.5, preferably from about 3.5 to about 3.

The additional acid is preferably added to an aqueous solution of the diazo condensation product and this acid solution is slowly added to an aqueous solution of the arylsulfonic acid with vigorous mixing which is continued until all of the acid solution has been added. The reaction is allowed to proceed at room temperature, although temperatures of from about 18° C. to about 25° C. are suitable. The reaction may be continued after the stirring is finished. Generally, reaction times of from about 30 minutes to about 2 hours are suitably used.

The amounts of the condensation product and organic coupling agent are selected to provide a molar ratio of from 1 to 1,5 and preferably 1 to 1.

When the resulting photosensitive reaction product that is obtained precipitates in the form of a sticky paste (the coefficient $\sigma$ of the arylsulfonic acid substituent used, if any, then being zero or negative), this indicates that the photosensitive reaction product is slightly soluble in water and that it is suitable within the context of this invention.

The paste is then separated from the reaction mixture and then redissolved in a solvent, which makes it possible to obtain a solution that is stable for several dozen days. The product can be obtained in solid form by precipitating the above solution with a suitable solvent.

Examples of the first-mentioned solvent in the preceding paragraph for redissolving the paste include, for example, ethylene glycol monomethyl ether (Methylcellosolve) and dimethylformamid Examples of the second-mentioned solvent for precipitating the redissolved paste include, for example, isopropanol and acetone.

The photopolymerizable compositions used in the invention are prepared by combining the epoxy resin and the photosensitive reaction product, generally from organic solutions of each component. Alternatively, the epoxy resin and photosensitive reaction product can be combined in the dry state by simple mixing and later dissolved in an organic solvent.

When it is desired to make visual aids having a photosensitive layer that is not sticky at ambient temperature to be able particularly to touch the layer without marking or damaging it, it is recommended to make compositions comprising 40% to 70% by weight, preferably 45% to 60% by weight of photosensitive reaction product and 30% to 60% by weight, preferably 40% to 55% by weight of epoxy resin.

To make it possible for the operator to see the parts of the photosensitive layer that have been exposed, polymerized and cross-linked, it is possible to incorporate in the composition according to the invention one or more colored indicators which become colored in an acid medium. Preferably, so as not to hinder the water development of the exposed layer, it is preferred that the weight of the color indicator be less than 10% by weight, preferably less than 5% by weight of the photopolymerizable composition.

However, in the majority of applications within the context of this invention, these color indicators will be replaced by permanent dyes as defined below. To obtain an easy development with running water, it is advisable not to deposit too thick a layer of the photopolymerizable composition on the transparent support.

It has generally been found that excellent results are obtained by depositing 0.5 g/m$^2$ to 2 g/m$^2$ of photopolymerizable layer and preferably 1 g/m$^2$ to 1.5 g/m$^2$ of photopolymerizable layer, on a dry basis. When too little photopolymerizable composition is deposited, there is the danger of not having a sufficiently homogenous, uniformly thin layer on the entire support. At deposition amounts greater than 2 g/m$^2$, it becomes difficult at times to remove the unexposed layer with water alone.

Any type of dyestuff soluble in organic solvents can be incorporated in the photosensitive layers described above as the permanent dye. By way of non-limiting example, there can be cited triphenylmethane and its derivatives such as victoria blue and methyl violet, rhodamines, alizarin yellows, RAL colored reagents of the UGINE-KUHLMANN Company, "Neozapon" and "Sudan" dyes of the BASF Company, ORASOL dyes of the CIBA-GEIGY Company, CERES dyes of the BAYER Company, etc.

In the case of color guide films, victoria blue, rhodamine and ORASOL yellows of the CIBA-GEIGY Company, respectively, will preferably be used to obtain cyan, magenta and yellow.

In the case of microcopy films, a mixture of the three above colors can advantageously be used.

In all cases, the total weight of the dye will be less than 20% of the photosensitive layer. Preferably, the amount of yellow dye will be limited to less than 10% by weight in relation to the weight of the photosensitive layer (actually, since yellow dye absorbs ultraviolet light, it is necessary to limit the weight deposited so as not to interfere with the cross-linking of the photosensitive layer in the exposed parts).

For graphic arts type films, there should be incorporated in the layer such ultraviolet absorbers as auramines, thioflavines, naphthol yellows, etc.

In all cases, the proportion of ultraviolet absorber should not be more than 5% by weight based on the weight of the photopolymerizable composition.

The support used, which should be transparent, can be of glass but preferably is of flexible plastic such as polyester, polycarbonate, polystyrene, cellulose or polyvinyl acetates, polyvinyl chloride, polyolefins, etc.

When a visual aid is desired that has a great dimensional stability, there will preferably be used a support of polyethylene terephthalate and more generally polyester or polycarbonate.

In a general way, to assure a good development of the visual aid with water only, it is preferable to use an substrated transparent support. This substrating layer should not exhibit any interaction with the photosensitive layer. In particular, it is important in certain applications of the visual aids according to the invention, such as those relating to lithographic printing, e.g. color selection guides, that this substrating layer does not fix the dyes of the photosensitive layer, which would leave a colored background fog after development.

A great number of resins can be used within the context of this invention as the substrating layer. In a general way, there can be cited resins with a base of polyvinylidene chloride, polyester resins, acrylic resins, etc.

Preferably there will be used a resin with an alkyl polymethacrylate base, such as methyl, ethyl, butyl, etc. polymethacrylate, alone or in mixtures, epoxy resins, phenol or cresol resins condensed with an aldehyde, phenol or cresol novolac epoxy resins; hardened gelatin, etc. The weight of the deposited substrating layer will be less than about 1 g/m$^2$ and preferably less than about 0.5 g/m$^2$.

Good results are obtained with hardened gelatin in which case the photosensitive layer is well isolated from the support and no interaction is noted between this layer and the epoxy resins or dyes. On the whole, the results obtained are good, the adherence of the photosensitive layer to the gelatin layer being sufficient. However, a slight yellow coloring of the gelatin is noted during development, the unexposed diazo part coloring the gelatin layer. This coloring disappears by complete reexposure of the visual aid under an ultraviolet lamp or simply after a longer time to ambient light during examination of the visual aid.

This type of film coated with a gelatinized coating layer has the advantage of being currently available on the market, for example, the supports usually used for silvered photographic films.

Phenoplast resins also give particularly interesting results. Preferably, phenol or cresol resins condensed with an aldehyde and preferably paraformaldehyde will be used. These novolac resins are now available on the market. These resins do not have any reaction with the photosensitive layer. Further, they are not hydrophilic and therefore do not absorb the diazonium compound during development with water. The support therefore remains colorless and the reexposure operation is no longer necessary as with the substrating layer with a hardened gelatin base.

Epoxy resins are particularly advantageous in the context of the invention as substrating layers, because they give excellent results, probably due to the good compatibility with the photosensitive layer that also includes epoxy resins. Any of the solid epoxy resins can be chosen. In particular, the entire series of EPIKOTE resins of the Shell Chemical Company are quite suitable, from reference 1001 to reference 1031.

Cresol or phenol novolac epoxy resins can also advantageously be used.

The invention will be better understood from the following non-limiting examples.

EXAMPLE 1—Blue film

A 5% photosensitive solution of solid in methylcellosolve is prepared—2.5 g of novolac epoxy resin 1139 of CIBA GEIGY and 0.25 g of victoria blue dye NSA 1750 of FRANCOLOR Company are dissolved in 55.25 g of methylcellosolve and there is added thereto 42 g of a 6% solution of condensed p-diazodiphenylamine formaldehyde p-toluenesulfonate in methylcellosolve. The condensed p-diazodiphenylamine formaldehyde p-toluenesulfonate is prepared as in Example 1 of the above-mentioned application Ser. No. 134,328 filed on the same day, and the entire disclosure of our other application is incorporated herein by reference.

This solution is applied to a gelatin coated polyester film for photographic applications.

It is coated with a whirler at 50 rpm for 30 seconds, dried in the whirler for 5 minutes at 40° C. and then dried in an oven for 5 minutes at 85° C.

The film thus treated is exposed through a negative montage under a 2-KW NUARC type arc lamp at a distance of 60 cm for 3 minutes. Development is done with a stream of water; the unexposed parts swell and dissolve in the water, then are completely and cleanly removed by rubbing lightly with a pad.

A positive blue image is obtained that can be used as a montage film. The uniform yellow coloring of the background disappears after exposure to light.

EXAMPLE 2—Red film

A 5% photosenitive solution of solid in methylcellosolve is prepared as follows: 2.5 g of novolac epoxy resin 1139 of the CIBA GEIGY Company, 0.125 g of extra rhodamine B of the CIBA GEIGY Company and 0.125 g of extra rhodamine 6 G dye of the CIBA GEIGY Company are dissolved in 55.25 g of methylcellosolve; there is added thereto 42 g of 6% solution of condensed p-diazodiphenylamine formaldehyde p-toluenesulfonate in methylcellosolve. This solution is applied to the same support as in the preceding example and in the same way.

The film thus treated is exposed as described in the preceding example: a red-violet visible image is obtained (visible in the unexposed parts).

After development in a stream of water, a red magenta positive is obtained that can be used as a color guide test film. To eliminate the yellow background coloring, a total reexposure of the film to white light is necessary.

EXAMPLE 3—Yellow film

There is prepared under the same conditions as in Example 1 a 5% photosensitive solution of solid in methylcellosolve in which the blue dye is replaced with an ORASOL GRLN yellow dye of the CIBA GEIGY Company. This solution is applied on the same support and under the same conditions as in Example 1. It is exposed and developed under the same conditions as in Example 1. A yellow positive image is obtained that can be used as a color guide test film.

EXAMPLE 4—Blue film

A 5% photosensitive solution of solid in methylcellosolve is prepared by dissolving 2.5 g of novolac epoxy resin 1139 of the CIBA GEIGY Company, and 0.25 g of victoria blue BNR of BASF in 55.5 g of methylcellosolve.

There is added thereto 42.5 g of a 6% solution of condensed p-diazodiphenylamine formaldehyde p-toluenesulfonate in methylcellosolve.

This solution is applied to a polyester film treated as follows

With a whirler at 200 rpm for 30 seconds, there is applied a 25% solution of ALNOVOL PM 430 phenol-formaldehyde resin in butanol, dried in the whirler for 5 minutes at 40° C. and then dried in an oven at 85° C. for 5 minutes.

The photosensitive solution is coated on the sheet thus prepared in a whirler at 50 rmp for 30 seconds, then dried in a whirler for 5 minutes at 40° C., and finally dried in an oven at 85° C. for 5 minutes.

The sheet is exposed under the same conditions as in Example 1. It is developed with water under the same conditions as Example 1. A positive blue film without dye fog on the film is obtained.

EXAMPLE 5—Red film

There is obtained under the same conditions as in Example 4 a red film using the same amount of rhodamine B or rhodamine 6G instead of victoria blue due. The results obtained are identical.

EXAMPLE 6—Yellow film

There is obtained under the same conditions as in Example 4 a yellow film by replacing the victoria blue dye with the same amount of Auramine 00 of the Societe R.A.L. UGINE-KUHLMAN. The results are identical.

EXAMPLE 7—Blue film

There is prepared under the same conditions as in Example 4 a 5% photosensitive solution of solid in methylcellosolve. The same blue dye is used.

This solution is applied to a polyester sheet treated as follows.

With a whirler at 200 rpm for 30 seconds, there is applied a 1% solution of novolac cresol epoxy resin 1299 of CIBA GEIGY in methylcellosolve, dried in the whirler for 5 minutes and then dried in an oven at 85° C. for 5 minutes.

The photosensitive solution is coated on the sheet thus treated under the same conditions as in Example 4.

The sheet is exposed under the same conditions as in Example 1.

It is developed with a stream of water under the same conditions as in Example 1. The results are excellent and there is no dye fog on the film.

EXAMPLE 8—Red film

There is obtained under the same conditions as in Example 7 a red film by replacing the victoria blue with the same amount of rhodamine B or 6G dye.

The results obtained are identical.

EXAMPLE 9—Yellow film

There is obtained under the same conditions as in Example 7 a yellow film by using or replacing victoria blue with the same amount of Auramine 00.

Identical results are obtained.

EXAMPLE 10—Magenta color

A 5% photosensitive solution A of solid in methylcellosolve is prepared as follows: 2.5 g of novolac epoxy resin 1139 of the CIBA GEIGY Company, 0.125 g of rhodamine B and 0.125 g of rhodamine 6G extra of CIBA GEIGY are dissolved in 55.5 g of methylcellosolve. To this solution is added 42.5 g of 6% solution of condensed p-diazodiphenylamine formaldehyde p-toluenesulfonate in methylcellosolve.

There is then prepared a substrating solution B, containing 2.5% by weight of EPIKOTE 1001 resin of the Shell Chemical Company solution in methylcellosolve.

This solution B is then coated in a whirler on a polyethylene terephthalate sheet at 200 rpm for 30 seconds, then dried in the whirler for 5 minutes at 40° C. and finally dried in an oven at 85° C. for 5 minutes.

On this polyester sheet thus treated solution A is applied in a whirler at 50 rpm for 30 seconds, then this layer is dried for 5 minutes in the whirler at 40° C. and finally 5 minutes in an oven at 85° C.

The sheet thus treated is exposed through a negative montage under a 2-KW NUARC arc lamp for 4 minutes at a distance of 60 cm. There is obtained a violet image visible in white light and inactinic light.

The visual aid thus obtained is then developed with a stream of water, with light friction with a pad. The quality of the resulting copy is excellent and there is no dye fog on the film. The visual aid obtained is an excellent magneta color guide.

EXAMPLE 11—Blue color

The operation is the same as in Example 10 but rhodamines B and 6G are replaced with 0.25 g of victoria blue BRN of the Societe BASF.

Under the same operating conditions as in Example 10 the same results are obtained. The resulting blue film can be used as an inactinic montage film.

EXAMPLE 12—Yellow color

The operation is the same as in Example 10 but the rhodamines B and 6G are replaced with 0.20 g of Auramine 00. By operating as in Example 10 (exposure time: 5 minutes), the same results are obtained. The resulting film is yellow and can be used as a color guide.

EXAMPLE 13—Black color

The operation is the same as in Example 10 but the rhodamines B and 6G are replaced with a mixture of the following dyes:
0.20 g of victoria blue BRN of BASF
0.20 g of methyl red of the Societe UGINE KUHLMAN
0.10 g of Auramine 00 of the Societe UGINE KUHLMAN Then the operation is the same as in Example 10 (exposure time: 5 minutes). A positive black film is obtained that can be used as a microfiche or as a duplicating film for graphic arts.

EXAMPLE 14—Black color

The same solution as in Example 13 is prepared and coated under the same conditions on a polyethylene terephthalate film coated with an adhesive coating layer obtained by coating of a 3.5% solution of EPON 1031 resin of the Shell Chemical Company in methylcellosolve, in a whirler at 200 rpm for 30 seconds. The coated layer is then dried for 5 minutes at 40° C. in the whirler and then for ;b 5 minutes in an oven at 85° C.

The operation is then as in Example 13. The resulting film is black and can be used as microfiche film or a duplicating film for graphic arts.

EXAMPLE 15—Black color

There is applied to a sheet of polyethylene terephthalate a 2.55 solution of Plexigum PM 381 (methyl and butyl polymethacrylate) of the Societe Rohm et Hass in methylcellosolve acetate. This coating is made as above in a whirler at 200 rpm for 30 seconds, the dried for 5 minutes in the whirler at 40° C. and finally dried in an oven for 5 minutes at 80° C. Then the operation is as in Example 14.

The resulting film has an optical density of 15 and can be used as a film for microfiches and as a duplicating film for graphic arts.

EXAMPLE 16—Yellow film

The same photosensitive solution as in Example 12 is made. This solution is applied to a film substrated with Plexigum PM 381 as in Example 15 and under the same operating conditions.

An excellent positive yellow film is obtained that can be used as a color guide.

What is claimed is:

1. A photosensitive article for making visual aids such as montage films, duplicating films, color guide films, microfiche films and the like which comprises a transparent support coated with a photosensitive layer of a film-forming, oleophilic photopolymerizable composition which is soluble in organic solvents consisting essentially of,
   (1) 30% to 60% by weight of at least one epoxy resin forming monomer or prepolymer, said epoxy resin or mixture of epoxy resins being fluid at ambient temperature and having an epoxy equivalent of less than about 350, a Durran melting point of about 38° C. or less and a viscosity of at least about 5000 centipoises at 25° C.; and
   (2) 40% to 70% by weight of a photosensitive reaction product of
      (a) a water-soluble, photosensitive condensation product of (i) a diazonium compound and (ii) an organic condensation agent, and
      (b) an organic coupling agent;
wherein said photosensitive reaction product (2) is soluble in organic solvents and only slightly soluble in water, whereby when said photosensitive layer is imagewise exposed to ultraviolet light, the exposed zones are polymerized and hardened and the unexposed zones are easily removable by washing with water alone.

2. Article according to claim 1 wherein the epoxy resin or mixture thereof has an epoxy equivalent less than or equal to 200.

3. Article according to claim 1 or 2 wherein the melting point of the epoxy resin or mixture thereof measured by the Durran method is less than or equal to 27° C.

4. Article according to claim 1 or 2 wherein the melting point of the epoxy resin or mixture thereof measured by the Durran method is less than or equal to 20° C.

5. Article according to claim 1 wherein the epoxy resin is selected from the group consisting of bisphenol A glycidyl ethers and/or phenol or cresol novolac epoxy resins used alone or in mixtures.

6. Article according to claim 1 wherein the epoxy resin is a bisphenol A diglycidyl ether.

7. Article according to claim 1 wherein the diazonium compound is a diazo arylamine compound.

8. Article according to claim 1 wherein the diazonium compound is paradiazodiphenylamine or a photosensitive negativeworking derivative thereof.

9. Article according to claim 1 wherein the organic condensation agent contains reactive carbonyl groups.

10. Article according to claim 1 wherein the organic condensation agent is an aldehyde or acetal.

11. Article according to claim 1 wherein the organic condensation agent is formaldehyde or paraformaldehyde.

12. Article according to claim 1 wherein the organic coupling agent is an arylsulfonic acid.

13. Article according to claim 1 the arylsulfonic acid has one or more substituents on the aryl nucleus wherein the Hammet $\sigma$ constant of the arylsulfonic acid substituent is negative.

14. Article according to claim 13 wherein the substituents on the arylsulfonic acid are alkyl or alkoxy substituents.

15. Article according to claim 14 wherein the arylsulfonic acid substituents are H, $CH_3$ or $C_2H_5$.

16. Article according to claim 1 wherein the organic coupling agent is selected from the group consisting of benzenesulfonic, toluenesulfonic or 2,5-dimethylbenzenesulfonic acids.

17. Article according to claim 1 wherein the photopolymerizable composition comprises 45% to 60% by weight of the photosensitive composition and 40% to 55% by weight of the epoxy resin or mixture thereof.

18. Article according to claim 1 wherein the photopolymerizable composition also comprises one or more dyes.

19. Article according to claim 18 wherein the total weight of dye in relation to the weight of the photosensitive composition is less than 20%.

20. Article according to claim 18 or 19 wherein the photopolymerizable composition comprises less than 10% by weight of yellow dye in relation to the total weight of said composition.

21. Article according to claim 1 wherein the weight of the photosensitive layer deposited on the support is between 0.5 g/m² and 2 g/m².

22. Article according to claim 1 wherein the weight of the photosensitive layer deposited on the support is between 1 g/m² and 1.5 g/m².

23. Article according to claim 1 wherein the transparent support is a flexible plastic film.

24. Article according to claim 23 wherein the plastic film is selected from the group consisting of polyester, polypropylene, cellulose acetate and polycarbonate.

25. Article according to claim 1 wherein the support is coated with a substrating layer.

26. Article according to claim 25 wherein the weight of the substrating layer deposited on the support is less than 1 g/m².

27. Article according to claim 26 wherein the weight of the substrating layer deposited on the support is less than 0.5 g/m².

28. Article according to any one of claims 25, 26 or 27 wherein the substracting layer is a hardened gelatin.

29. Article according to any one of claims 25, 26 or 27 wherein the substrating layer has a polyvinylidene chloride base.

30. Article according to any one of claims 25, 26 or 27 where the substrating layer is a polyester resin.

31. Article according to any one of the claims 25, 26 or 27 wherein the substrating layer is an acrylic resin.

32. Article according to claim 31 wherein the acrylic resin is at least one of polymethylmethacrylate, polyethylmethacrylate or polybutylmethacrylate.

33. Article according to any one of claims 25, 26 or 27 wherein the substrating layer is at least one of an epoxy resin, novolac resin or novolac epoxy resin.

34. Article according to claim 1 which comprises a transparent support having a substrating layer on one side thereof and said photosensitive layer on both sides of the transparent support.

35. A visual aid obtained by imagewise exposing to ultraviolet light the photosensitive article of claim 1 to polymerize and harden the exposed zones and developing the latent image by removing the unexposed zones by washing them with water.

* * * * *